United States Patent [19]

Ho

[11] Patent Number: 4,897,305
[45] Date of Patent: Jan. 30, 1990

[54] PLASMA TREATMENT WITH ORGANIC VAPORS TO PROMOTE A METAL ADHESION OF POLYPROPYLENE FILM

[75] Inventor: Floyd F.-L. Ho, West Chester, Pa.

[73] Assignee: Hercules Incorporated, Wilmington, Del.

[21] Appl. No.: 25,122

[22] Filed: Mar. 12, 1987

[51] Int. Cl.$^4$ .................. B05D 3/04; B32B 15/05; B32B 27/16; B32B 27/32
[52] U.S. Cl. .................. 428/333; 428/461; 428/516; 427/40
[58] Field of Search ............... 428/450, 461, 462, 500, 428/516, 333; 427/40, 41; 156/272.6, 272.2, 275.5; 204/168, 170

[56] References Cited

U.S. PATENT DOCUMENTS

| | | | |
|---|---|---|---|
| 4,337,279 | 6/1982 | Polak | 427/40 |
| 4,345,005 | 8/1982 | All et al. | 427/40 |
| 4,374,717 | 2/1983 | Drauglis et al. | 204/192 |
| 4,390,595 | 6/1983 | Yamagishi | 204/170 |
| 4,429,024 | 1/1984 | Ueno et al. | 427/41 |
| 4,536,271 | 8/1985 | Collins | 204/192 |
| 4,548,864 | 10/1985 | Nakayama et al. | 428/699 |
| 4,622,237 | 11/1986 | Lori | 427/40 |
| 4,632,844 | 12/1986 | Yanagihara et al. | 427/40 |
| 4,636,435 | 1/1987 | Yanagihara et al. | 427/41 |
| 4,692,380 | 9/1987 | Reid | 428/461 |
| 4,693,927 | 9/1987 | Nishikawa et al. | 427/41 |
| 4,743,327 | 5/1988 | DeHaan et al. | 427/41 |
| 4,780,354 | 10/1988 | Nakayama et al. | 428/141 |

Primary Examiner—George F. Lesmes
Assistant Examiner—Elizabeth M. Cole
Attorney, Agent, or Firm—David Edwards

[57] ABSTRACT

Metal adhesion to a polyolefin substrate is improved by subjecting the substrate to a plasma treatment with aliphatic hydrocarbon vapors.

7 Claims, 1 Drawing Sheet

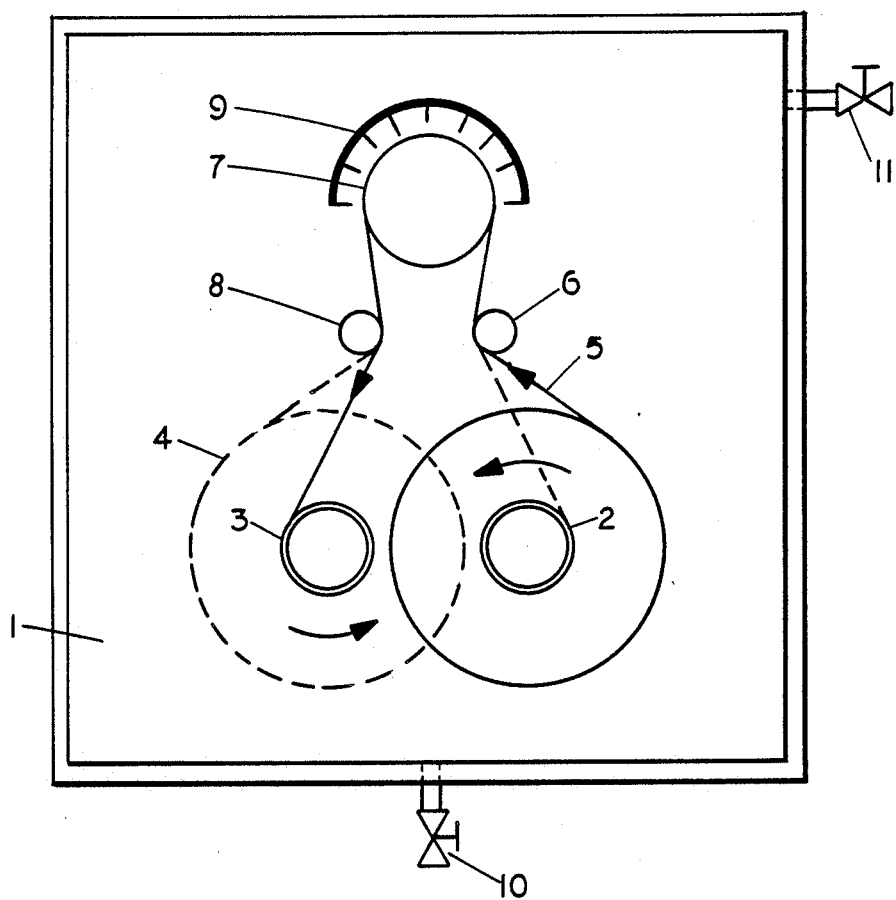

PLASMA TREATMENT WITH ORGANIC VAPORS TO PROMOTE A METAL ADHESION OF POLYPROPYLENE FILM

This invention relates to a polyolefin film having a metal coating applied to at least one surface thereof. More specifically, it relates to a metallized film wherein the polyolefin film substrate has been made metallizable by a plasma treatment.

Metallized plastic films are widely used in the packaging industry due to several outstanding properties, including high strength, good air and moisture barrier characteristics and generally excellent decorative appeal. However, most of these films, particularly the polyolefins, lack the ability to form strong bonds with the metal coating and usually require some type of an interlayer between the film substrate and the metal layer to serve as an adhesive.

To secure metal coatings to polyolefin films, it has been proposed to apply the metal to a tacky polymer interlayer applied to the film surface such as, e.g., a low molecular weight olefin copolymer. However, coating or lamination processes are quite expensive and also add an entirely new layer to the surface of the film which is much thicker than is actually required for adhesion and thus adds to the total gauge of the film undesirably. Moreover, the thickness of these layers also detracts from the aesthetic qualities of the film. it has also been proposed to prepare the film surface for metallization by a corona treatment, but the adhesion effected by this technique is not particularly good.

In accordance with this invention, it has been found that a film which has been exposed to a plasma medium of an aliphatic hydrocarbon has greatly improved metallizability. More specifically, the invention is a metallized film comprising a polyolefin substrate and a metal coating on at least one surface thereof, said substrate having been subjected, prior to metallization, to a plasma treatment with organic vapors to promote metal adhesion, said organic vapors being selected from the class consisting of saturated and unsaturated aliphatic hydrocarbons having up to 12 carbon atoms and mixtures thereof. Preferred are hydrocarbons of 2 to 5 carbon atoms.

The concept of treating a film or other shaped polymer article with an organic plasma to alter its surface properties is not, in itself, novel. For example, U.S. Pat. No. 4,536,271 to Collins teaches use of a plasma treatment to strengthen a plastic film. According to this patent, a thin surface layer which is weak and brittle is present on the surface of all plastic films. This layer is said to be weak and easily broken, thereby contributing to failure to the total film. Treatment with certain inorganic or organic plasmas, including hydrocarbon gases, is said to remove this layer, thus strengthening the film. U.S. Pat. No. 4,374,717 to Drauglis et al teaches treating a polyurethane shaped article with an acetonitrile plasma to deposit a thin layer of acetonitrile polymer on the surface of the shaped article following which a sputtered chromium coating is applied to the treated surface.

In accordance with this invention, it is surprisingly found that plasma treatment in the presence of aliphatic hydrocarbons not only strengthens a polyolefin film, it also renders it metallizable. Moreover, metallized films based on plasma treated polyolefins exhibit metal adhesion in excess of that presently known. It is very surprising that good metal-to-polyolefin adhesion is achieved since the treatment (believed to result in the deposition of a thin layer of olefin polymer to the polyolefin surface) does not alter the other properties of the substrate film noticeably. In particular, the treatment does not alter the nonpolar nature of the film and at least a small degree of polarity is usually believed to be a requirement for metal adhesion.

The plasma treatment usable in this invention to prepare metallizable films can be carried out in equipment such as that shown in the attached drawing. The plasma treater shown in a vacuum chamber 1 containing a feed station 2 and a take-up station 3. A roll of film is mounted at feed station 2 and film 5 is fed under idler roll 6, around treating roll 7, under idler roll 8 to take up station 3. Treating roll 7 serves as the ground electrode for plasma generation in conjunction with active electrode 9. The desired environment with the treatment chamber is maintained by drawing a vacuum through vacuum port 10 by a pump or other means, not shown, and admitting the selected treatment gas through vapor inlet 11 from a treatment gas source, not shown. Other structural features such as support members and doors are omitted, for the sake of simplicity.

For treatment with an aliphatic hydrocarbon plasma, a relatively short exposure time at relatively low power is satisfactory. Thus, a treatment time of about 6 to 30 seconds at about 40 to 80 watts and a vacuum level of about 0.5 to 1 torr has been found to be optimum. The critical factor in the conditions appears to be the vacuum level. At pressures above about 1 torr, the life of the reactive species appears to be shortened and thus higher power and longer residence times become necessary. The higher power generates heat which, in combination with the increased residence time, can lead to deterioration of film properties. Increased residence time also decreases output of the equipment, leading to undesirable cost increases.

The increased adhesion between the polyolefin substrate and the metal is attributed to the deposition of a very thin, almost mono molecular layer of a low molecular weight hydrocarbon polymer on the surface of the polyolefin. For reasons which are not clearly understood, this very thin layer of hydrocarbon polymer adheres to the polyolefin film extremely tenaciously. In most cases, the adhesion is better than the adhesion to a laminated propylene-ethylene copolymer which is the currently preferred inter-layer between the substrate and the metal coating layer.

In addition to improved adhesion, the metal coated films also exhibit an excellent visual effect. The brightness, image clarity, shiny appearance and overall aesthetic impact are very high. The thicker copolymer coatings on the more conventional laminates frequently introduce problems in this regard due to the inherently reduced clarity of the thicker substrate as well as to crazing which sometimes occurs in the copolymer layer.

Plasma treatment to prepare the metallized films of this invention can be carried out with any aliphatic hydrocarbon containing up to 12 carbon atoms and preferably 2 to 5 carbon atoms. Particularly preferred are the unsaturated hydrocarbons such as the alkenes and alkynes such as ethylene, propylene, butene-1, pentene-1, acetylene or methyl acetylene. The most preferred plasma treatment is with ethylene or mixtures of ethylene and propylene.

The most popularly used metal for coating plastic films is aluminum. However, other metals also exhibit excellent adhesion to plasma treated polyolefins, e.g., chromium, gold, silver and copper can be applied to good effect. The metallization can be carried out by sputtering or, more normally, by vacuum deposition. Both techniques are well known and widely used.

The improved adhesion of metal coatings is demonstrated by the examples which follow and the controls included therewith. Samples of vacuum metallized film were laminated at 260° F. under 20 psi pressure for 20 seconds to a polypropylene/ethylene-propylene copolymer composite film with the metal in contact with the copolymer. The laminates were pulled at a 180° angle on an Instron ® tensile tester and the peak adhesion value was recorded for each laminate. The amount of metal lifted from the plasmatreated polyolefin substrate film was also recorded. This test is referred to as the "Laminated Bond Prediction Test." In a second test method, a strip of adhesive tape (Scotch #610 prescription adhesive tape) was applied securely to the metal surface and pulled in a similar manner. Again peak adhesion value and % metal lift were noted. This test is referred to as the "Peel Test".

A low value for the metal lift parameter indicates that the bond between the plasma treated film and the metal is stronger than the peak adhesion value presented in the table since, in such cases, separation has taken place between the metal and the ethylene-propylene copolymer layer. Conversely the high values for metal lift indicate that separation has taken place between the metal and the plasma treated substrate and thus the peak adhesion values are absolute.

EXAMPLES 1 TO 9

A series of samples of polypropylene homopolymer film were plasma treated under different conditions of time and power in ethylene gas at different pressures. These were coated with a layer of aluminum about 1 micron thick in a commercial vacuum deposition metallizer. Treating conditions and adhesion values by both the Laminated Bond Prediction Test and the tape test are recorded in Table I.

TABLE I

| Example No. | Treatment Conditions | | | Laminated Bond Adhesion % | | Peel Test % | |
|---|---|---|---|---|---|---|---|
| | Watts | Torr | Time (secs) | Peak (g/in) | Metal Lift | Peak (g/in) | Metal Lift |
| 1 | 40 | 0.5 | 6 | 404 | 0 | 518 | 0 |
| 2 | 40 | 0.5 | 15 | 469 | 0 | 495 | 0 |
| 3 | 40 | 0.5 | 30 | 557 | 0 | 439 | 0 |
| 4 | 40 | 1.0 | 6 | 552 | 0 | 554 | 0 |
| 5 | 40 | 1.0 | 15 | 526 | 0 | 547 | 0 |
| Untreated Control | | | | 13 | 100 | 457 | 40 |
| Commercial Product | | | | 172 | 10 | 488 | 0 |
| 6 | 80 | 1.0 | 6 | 411 | 0 | 541 | 0 |
| 7 | 40 | 2.0 | 6 | 509 | 0 | 501 | 0 |
| 8 | 40 | 2.0 | 15 | 422 | 80 | 475 | 0 |
| 9 | 40 | 2.0 | 30 | 421 | 80 | 468 | 0 |

EXAMPLES 10 TO 21

Another series of polypropylene homopolymer film samples were plasma treated for different time periods in propylene gas at different pressures. Power level in all cases was 40 watts. These were coated with aluminum (1 micron layer) in a laboratory scale vacuum deposition metallizer. Treating conditions and adhesion values via the Laminated Bond Prediction Test are recorded in Table II.

TABLE II

| Example No. | Treatment Conditions | | Laminated Bond Adhesion | |
|---|---|---|---|---|
| | Torr | Time | Peak (g/in) | % Metal Lift |
| 10 | 0.5 | 6 | 206 | 0 |
| 11 | 0.5 | 3 | 83 | 100 |
| 12 | 0.5 | 1.5 | 41 | 100 |

It is clear from the data that improvements can be affected via the treatment with propylene plasma although for best results longer treatment time is required than in the case of treatment with ethylene gas.

EXAMPLES 13 TO 16

The procedure of Examples 10 to 12 was repeated with a mixture of ethylene and propylene as the treating gas. Details of these examples are reported in Table III.

TABLE III

| Example No. | Gas Mix* (%) | Time | Peel Test | |
|---|---|---|---|---|
| | | | Peak Value | Metal Lift |
| 13 | 23/77 | 6 sec | 174 | 0 |
| 14 | 23/77 | 3 sec | 87 | 100 |
| 15 | 50/50 | 6 sec | 207 | 0 |
| 16 | 50/50 | 3 sec | 106 | 95 |
| Untreated Control | — | | 49 | 93 |
| Commercial Film** | — | | 138 | 10 |

*Ratio of ethylene to propylene.
**Commercial film is metallized homopolymer with a corona treated ethylene-propylene layer.

What is claimed is:

1. A metallized film comprising a polyolefin substrate and a metal coating on at least one surface thereof and a very thin, almost mono molecular layer of a low molecular weight hydrocarbon polymer in between the polyolefin substrate and the metal coating where the hydrocarbon polymer layer is formed by subjecting said substrate, prior to metallization, to a plasma treatment with organic vapors to promote metal adhesion, said metal coating being selected from the class consisting of aluminum, chromium, gold, silver, and copper and said organic vapors being selected from the class consisting of saturated and unsaturated aliphatic hydrocarbons having up to 12 carbon atoms and mixtures thereof.

2. The film of claim 1 wherein the hydrocarbon is ethylene.

3. A metallized film according to claim 2 wherein the polyolefin substrate is a propylene polymer.

4. The film of claim 1 wherein the hydrocarbon is propylene.

5. A metallized film according to claim 4 wherein the polyolefin substrate is a propylene polymer.

6. The film of claim 1 wherein the hydrocarbon is a mixture of ethylene and propylene.

7. A metallized film according to claim 6 wherein the polyolefin substrate is a propylene polymer.

* * * * *

UNITED STATES PATENT AND TRADEMARK OFFICE
CERTIFICATE OF CORRECTION

PATENT NO.   :   4,897,305
DATED        :   JANUARY 30, 1990
INVENTOR(S)  :   Floyd F.L. Ho It is certified that error appears in the above-identified patent and that said Letters Patent is hereby corrected as shown below:

Column 1, Line 29

"film. it"   should read   --film. It--

Column 2, line 19, "with" should read --within--

Column 3, line 17, "plasmatreated" should read --plasma treated --.

Signed and Sealed this

Seventh Day of May, 1991

Attest:

HARRY F. MANBECK, JR.

Attesting Officer

Commissioner of Patents and Trademarks